(12) United States Patent
Sato et al.

(10) Patent No.: US 6,194,226 B1
(45) Date of Patent: Feb. 27, 2001

(54) JUNCTION BETWEEN WIRES EMPLOYING OXIDE SUPERCONDUCTORS AND JOINING METHOD THEREFOR

(75) Inventors: Kenichi Sato; Takeshi Kato; Nobuhiro Shibuta; Hidehito Mukai, all of Osaka (JP)

(73) Assignee: Sumitomo Electric Industries, Ltd. (JP)

( * ) Notice: Subject to any disclaimer, the term of this patent is extended or adjusted under 35 U.S.C. 154(b) by 0 days.

(21) Appl. No.: 09/112,970

(22) Filed: Jul. 9, 1998

Related U.S. Application Data

(62) Division of application No. 08/446,349, filed on May 22, 1995, now Pat. No. 5,949,131, which is a continuation of application No. 08/179,899, filed on Jan. 10, 1994, now abandoned, which is a continuation of application No. 07/840,430, filed on Feb. 24, 1992, now abandoned.

(30) Foreign Application Priority Data

| Feb. 25, 1991 | (JP) | 3-30398 |
| Mar. 20, 1991 | (JP) | 3-56677 |
| Mar. 20, 1991 | (JP) | 3-56678 |
| Mar. 20, 1991 | (JP) | 3-56679 |
| Mar. 20, 1991 | (JP) | 3-56680 |
| Mar. 20, 1991 | (JP) | 3-56681 |
| Mar. 20, 1991 | (JP) | 3-56682 |
| Mar. 20, 1991 | (JP) | 3-56683 |

(51) Int. Cl.[7] .................................. H01L 21/00
(52) U.S. Cl. .............................. 438/2; 257/662
(58) Field of Search ................ 438/2; 257/662, 257/663; 505/230, 704

(56) References Cited

U.S. PATENT DOCUMENTS

| 5,082,164 | * | 1/1992 | Rumaner et al. | 228/176 |
| 5,104,028 | * | 4/1992 | Martincic et al. | 228/111 |
| 5,109,593 | * | 5/1992 | Benz et al. | 29/599 |
| 5,114,908 | * | 5/1992 | Sato et al. | 505/1 |
| 5,116,810 | * | 5/1992 | Joshi et al. | 505/1 |
| 5,134,040 | * | 7/1992 | Benz et al. | 428/646 |
| 5,358,929 | * | 10/1994 | Fujikami et al. | 505/100 |

FOREIGN PATENT DOCUMENTS

| 0501394A2 | * | 2/1992 | (DE) | 4/68 |
| 357050210 | * | 3/1982 | (JP) | 23/22 |
| 57-74983 | | 5/1982 | (JP) | H01R/43/04 |
| 61-188277 | | 11/1986 | (JP) | H01R/43/04 |
| 64002264 | * | 6/1987 | (JP) . | |
| 62-123669 | | 6/1987 | (JP) | H01R/4/68 |
| 62-54236 | | 11/1987 | (JP) | H01R/4/68 |
| 63-284767 | | 11/1988 | (JP) | H01R/4/68 |
| 63-313484 | | 12/1988 | (JP) | H01R/43/02 |
| 2227248 | * | 2/1989 | (JP) . | |
| 01302676 | | 12/1989 | (JP) | H01R/43/00 |
| 02186575 | | 7/1990 | (JP) | H01R/43/02 |
| 02242572 | | 9/1990 | (JP) | H01R/4/68 |
| 2-252664 | | 10/1990 | (JP) . | |
| 03030264 | | 2/1991 | (JP) | H01R/4/68 |
| 03030265 | | 2/1991 | (JP) | H01R/4/68 |

* cited by examiner

*Primary Examiner*—Carl Whitehead, Jr.
*Assistant Examiner*—Maria Guerrer
(74) *Attorney, Agent, or Firm*—Pennie & Edmonds LLP

(57) ABSTRACT

According to one aspect, provided is a junction between tape-type superconductors, which are formed of metal-coated oxide superconductors. The superconductors of the superconducting wires, which are oppositely joined to each other, are overlapped with each other. According to another aspect, provided is a method of joining tape-type superconducting wires formed of metal-coated oxide superconductors, which comprises a step of preparing tape-type superconducting wires having portions to be joined, a step of separating metal coatings from first sides of the superconductors in the portions to be joined for exposing the superconductors, a step of overlapping the exposed superconductors with each other, and a step of joining the overlapped superconductors to each other. In the junction obtained according to these aspects, it is possible to stably carry a uniform superconducting current.

15 Claims, 16 Drawing Sheets

JUNCTION BETWEEN WIRES EMPLOYING OXIDE SUPERCONDUCTORS AND JOINING METHOD THEREFOR

This is a divisional of application Ser. No. 08/446,349 filed May 22, 1995 now U.S. Pat. No. 5,949,131, which is a continuation application of Ser. No. 08/179,899, filed Jan. 10, 1994 now abandoned, which is a continuation application of Ser. No. 07/840,430 filed Feb. 24, 1992 now abandoned.

BACKGROUND OF THE INVENTION

1. Field of the Invention

The present invention relates to a junction between superconducting wires which are prepared from oxide high-temperature superconductive materials.

2. Description of the Background Art

In recent years, superconductive materials of ceramics, i.e., oxide superconductors, are watched with interest as those which can exhibit higher critical temperatures. Among such materials, particularly expected for practical application are yttrium, bismuth and thallium based superconductors, which exhibit high critical temperatures of about 90 K, 110 K and 120 K respectively. Such high-temperature superconductive materials may be applied to a cable, a bus bar, a current lead, a coil and the like, and technique for elongation of superconducting wires has been developed.

In application of such high-temperature superconductive materials, it is necessary to obtain long wires having stable properties, as well as to form a junction, which is stabilized and brought into a superconducting state, between such superconducting wires in a state capable of ensuring a heavy current. In particular, a permanent current junction is required in application to a coil. In such a permanent current junction, it is necessary to join superconductors to each other in order to carry a superconducting current.

SUMMARY OF THE INVENTION

An object of the present invention is to provide a stable junction with respect to superconducting wires which are prepared from oxide high-temperature superconductive materials.

Another object of the present invention is to provide a method of manufacturing a stable junction which can carry a superconducting current.

According to one aspect of the present invention, provided is a junction between tape-type superconducting wires formed of metal-coated oxide superconductors, where the superconductors of the superconducting wires which are oppositely joined to each other are overlapped with each other. At the junction, the superconductors forming the superconducting wires must indispensably be joined to each other through no other material.

At the junction, further, the superconductors are overlapped with each other preferably over a length of at least about 5 mm, in order to obtain a stable junction.

According to the present invention, tape-type wires which are formed by covering oxide superconductors with metal coatings are employed as wires of high-temperature superconductors. The material for the metal coatings is preferably unreactive with the high-temperature superconductors, and easily workable. Further, this material preferably has small specific resistance, for serving ass a stabilizer. Such a metal material can be preferably prepared from silver or a silver alloy. Such a material of silver or a silver alloy can be employed as a coating material itself or an intermediate layer for coating. When such a material is applied to an intermediate layer, another metal such as copper, aluminum, nickel, stainless steel or an alloy thereof is further employed as a coating material.

Each oxide superconductor is prepared from a yttrium, bismuth or thallium based super conductor, for example. A bismuth based superconductor is particularly preferable in view of its critical temperature, a high current density, low toxicity and unnecessity for rare earth elements.

In the junction according to the present invention, it is possible to carry a superconducting current since superconductors are overlapped with each other. Such a junction is so stably formed that the same is usefully applied to a permanent current junction of a coil as well as to a junction of a heavy-current conductor.

The junction according to the present invention may be formed through superconducting wires which are so structured that portions of superconductors to be joined are larger in sectional area than other portions. Such structure of superconducting wires can be implemented by increasing the portions to be joined at least in width or thickness as compared with the remaining portions, for example. When superconducting wires of such structure are joined to each other, the junction area as well as the sectional areas of the superconductors are increased at the junction. Even if the amount of the critical current per unit area is slightly reduced at the junction between the superconductors, therefore, the overall amount of the current flowing through the junction is not reduced. Thus, it is possible to prevent the junction from restricting the overall critical current of the as-formed superconducting wire, thereby maintaining a high critical current over the entire wire.

In the junction according to the present invention, the overlapped portions of the superconductors may be covered with a metal. Such a metal may be prepared from the same material as the metal coatings for the superconducting wires, silver or the like, for example. Such a metal cover protects the superconductors against influence by external environment, such as the atmosphere, a cooling medium and the like, for example, and prevents the same from deterioration.

In the junction according to the present invention, end surfaces of the joined superconductors may be inclined at prescribed angles with respect to the cross direction of the superconducting wires, while end surfaces of the metal coatings at the joined portions may be substantially in parallel with the end surfaces of the superconductors or inclined at symmetrical angles thereto. In such a junction, it is possible to define a long boundary surface between the joined superconductors.

In the junction according to the present invention, a plurality of superconducting wires may be overlapped in layers to be joined to another set of a plurality of superconducting wires. In this case, joined portions of the superconducting wires in the respective layers are successively displaced from each other along the longitudinal direction of the superconducting wires.

According to another aspect of the present invention, provided is a junction between tape-type superconducting wires formed of metal-coated oxide superconductors, where the superconductors of the superconducting wires, which are oppositely joined to each other, are overlapped with still another superconductor. The superconductors of the tape-type superconducting wires are overlapped with the still other superconductor preferably over a length of at least about 5 mm. Such a junction is applied when it is difficult to directly join the superconducting wires to each other. At the junction, it is possible to carry a superconducting current since the superconductors are joined to each other. This junction is particularly usefully applied to a permanent current junction of a coil and a junction of a heavy-current conductor.

According to still another aspect of the present invention, provided is a method of joining tape-type superconducting wires formed of metal-coated oxide superconductors, which comprises a step of preparing tape-type superconducting wires having portions to be joined, a step of separating metal coatings from first sides of the superconductors for exposing the superconductors of the superconducting wires in the portions to be joined, a step of overlapping the exposed superconductors with each other, and a step of joining the overlapped superconductors to each other.

The method according to the present invention employs tape-type wires formed by covering oxide superconductors with metal coatings as wires of high-temperature superconductors. The material for the metal coatings is preferably unreactive with the high-temperature superconductors, and easily workable. Further, this material preferably has small specific resistance for serving as a stabilizer. Such a metal material can be preferably prepared from silver or a silver alloy. Such a material of silver or a silver alloy can be employed as the coating material itself or an intermediate layer for coating. When the material is applied to an intermediate layer, another metal such as copper, aluminum, nickel, stainless steel or an alloy thereof is further employed as a coating material.

Each oxide superconductor is prepared from a yttrium, bismuth or thallium based superconductor, for example. A bismuth based superconductor is particularly preferable in view of its critical temperature, a high current density, low toxicity and unnecessity for rare earth elements.

In the separation step of this method, the metal coatings covering the portions to be joined are partially separated and removed from the superconductors, or partially turned up. Such metal coatings are preferably removed or turned up after unnecessary portions of the metal coatings are removed from both sides of end portions of the superconducting wires to be joined. Before such separation of the metal coatings, it is preferable to remove portions formed by only the metal coatings from end portions of the superconducting wires.

In the overlapping step, the superconductors are overlapped with each other preferably over a length of about 5 mm, in order to attain a stable junction.

In the joining step, the overlapped portions of the superconductors may be deformation-processed or press-worked. After such processing, at least the processed portions may be heat treated.

On the other hand, the joining step may include a step of heat treating the overlapped portions of the superconductors with application of a pressure. Such a pressure may be applied with a glass tape, a hot press or the like. This ensures the junction of the superconductors.

The method according to the present invention may further include a step of covering the overlapped portions of the superconductors with a metal, following the overlapping step. In order to cover the overlapped portions of the superconductors, it is possible to employ the same metal as the metal coatings for the superconducting wires, silver, a silver alloy, or the like. Such a metal cover can protect the superconductors against influence by external environment.

In the joining step, therefore, an atmosphere for sintering by heat treatment can bring the same effect to the junction and the remaining portions. The junction and the remaining portions are prevented from difference of superconducting properties, whereby it is possible to obtain a joined member having homogeneous properties as a whole. Further, no atmosphere nor cooling medium comes into contact with the superconductors at the as-formed junction, whereby it is possible to prevent deterioration of superconducting properties.

According to the present invention, it is possible to form a pair of end surfaces which are inclined at prescribed angles with respect to the cross direction of the superconducting wires in the preparation step. In the subsequent separation step, it is possible to expose the superconductors so that end surfaces of the metal coatings formed by separation thereof are in parallel with the end surfaces of the superconductors or inclined at symmetrical angles thereto. In the subsequent overlapping step, it is possible to overlap the exposed superconductors with each other while butting the inclined end surfaces of the superconductors with the inclined end surfaces of the metal coatings on first sides of the counter superconductors. According to such a joining method, the end surfaces of the pair of superconductors to be joined to each other and the inclined end surfaces of the metal coatings to be butted therewith are inclined with respect to the cross direction of the superconducting wires. Thus, it is possible to define a long boundary surface at the junction between the superconductors, thereby suppressing bending of the superconductors, which may be caused in the joined portions. Therefore, it is possible to reduce lowering of the critical current at both ends of the junction. Such a joining method further improves reliability of the junction. This method is useful for a permanent current junction of a coil and a junction of a heavy-current conductor.

According to a further aspect of the present invention, provided is a method of joining a set of a plurality of tape-type superconducting wires overlapped in layers to another set of a plurality of similar tape-type superconducting wires, which comprises a step of separating metal coatings from first sides in joined portions of the plurality of tape-type superconducting wires for exposing superconductors, a step of arranging the superconducting wires of the respective layers so that the joined portions thereof are successively displaced from each other along the longitudinal direction, a step of overlapping the exposed superconductors with each other in the respective layers, and a step of joining the plurality of overlapped superconducting wires to each other. The tape-type superconducting wires are formed of metal-coated oxide superconductors, similarly to the above. In the joining step, it is possible to heat-treat the overlapped portions of the superconductors after deformation processing or press working, in order to join the superconductors to each other. In such a joining method, the tape-type superconducting wires overlapped in layers are so arranged that joined portions of the superconducting layers are successively displaced from each other in the longitudinal direction. The joined portions, which are slightly larger in thickness than the remaining portions, are longitudinally dispersed with respect to the respective superconducting wires. Thus, it is possible to disperse distortion caused in a pressing operation for joining the superconductors, for example. According to such a joining method, it is possible to suppress reduction of the critical current, which may be caused since a plurality of tape-type wires are overlapped with and joined to each other. This method can be effectively applied to a permanent current junction of a coil and a junction of a heavy-current conductor.

According to a further aspect of the present invention, provided is a method of joining tape-type superconducting wires formed of metal-coated oxide superconductors, which comprises a step of preparing tape-type superconducting wires having portions to be joined, a step of separating metal coatings from first sides in the portions to be joined for exposing the superconductors of the tape-type superconducting wires, and a step of joining the exposed superconductors to each other while interposing still another superconductor therebetween. According to this method, it is possible to expose the superconductors by removing the metal coatings from the portions to be joined. Such a separation step is preferably carried out after removal of cross-directional portions formed by only the metal coatings. Then, the exposed superconductors to be joined are overlapped with a separately prepared oxide superconductor respectively. The superconductors are overlapped with each other preferably over a length of at least about 5 mm, to attain a stable junction. It is possible to join the overlapped portions of the superconductors to each other by heat treating the same after deformation processing or press working. According to this method, the superconducting wires are joined to each other through a separately prepared oxide superconductor. This method is effectively applied when it is difficult to directly join superconducting wires. Interposition of the superconductor at the junction is suitably applied to a permanent current junction of a coil and a junction of a heavy-current conductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
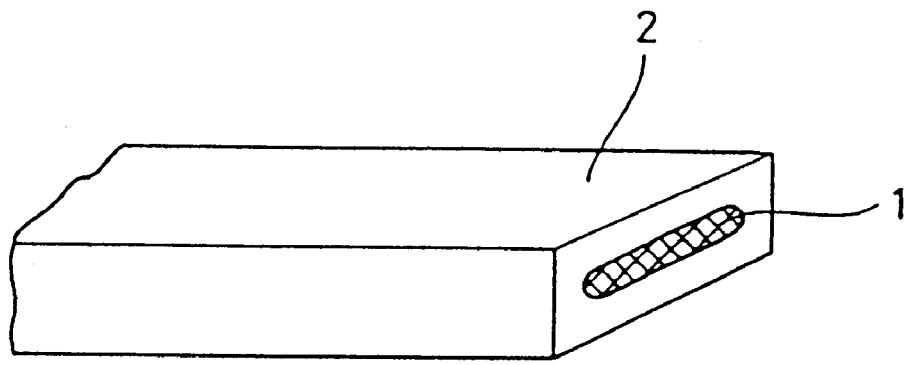
FIG. 1 is a perspective view showing a superconducting wire prepared in Example 1 of the present invention, which is still entirely covered with a metal coating.

Oxides or carbonates were mixed so that Bi, Pb, Sr, Ca and Cu were in composition ratios of 1.80:0.41:2.01:2.18:3.02, and this mixture was heat treated to prepare powder mainly consisting of 2212 phases and non-superconducting phases, which in turn was degassed in a decompressed atmosphere of 6 Torr at 760° C. for 3 hours. The powder was covered with a silver pipe of 12 mm in outer diameter and 8 mm in inner diameter, drawn into 1 mm in diameter, and rolled into 0.18 mm in thickness. The as-formed wire was heat treated and sintered at 845° C. for 50 hours. FIG. 1 shows the as-obtained wire. Referring to FIG. 1, an oxide high-temperature superconductor 1 is covered with a metal coating 2.

Figure 2:
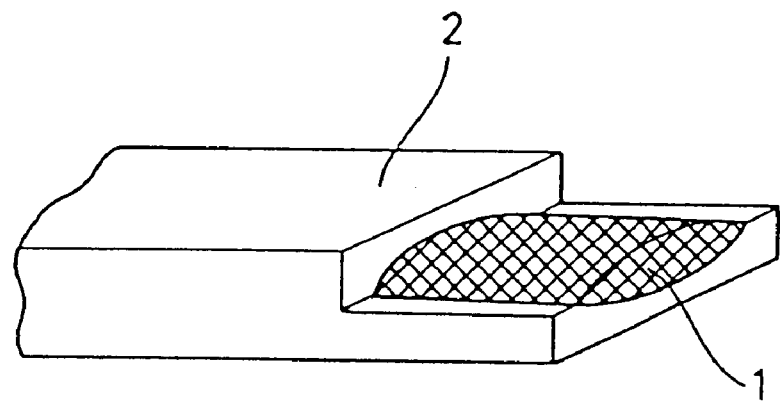
FIG. 2 is a perspective view showing the superconducting wire prepared in Example 1 of the present invention, whose metal coating is separated before a joining operation.

An end of this wire was processed as shown in FIG. 2, to expose the oxide high-temperature superconductor 1. A pair of such wires were so superposed that the exposed portions of the oxide high-temperature superconductors 1 processed as shown in FIG. 2 were overlapped with each other over a length of 8 mm, and pressed with a load of 20 tons to attain a thickness of 0.15 mm as a whole.

The as-formed wire was heat treated at 840° C. for 50 hours. At the liquid nitrogen temperature, the junction of this wire exhibited a critical current of 30 to 40 A, which was proved to be equivalent to that of this wire at the liquid nitrogen temperature.

EXAMPLE 2

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases, which in turn was degassed in a decompressed atmosphere of 8 Torr at 760° C. for 2 hours. The powder was covered with a silver pipe of 12 mm in outer diameter and 8 mm in inner diameter, drawn into 1 mm in diameter and rolled into 0.18 mm in thickness.

The as-formed wire was heat treated at 850° C. for 50 hours. Two such wires were prepared and the silver coatings were separated from first sides thereof over lengths of 10 mm to expose superconductor portions, and a thin tape of 3 μm in thickness, which was extracted from a bismuth superconductor in a central portion of a superconducting tape wire, was interposed between the exposed superconductors. This structure was pressed with a load of 30 tons, and heat treated at 840° C. for 50 hours. At the liquid nitrogen temperature, the junction of the as-formed wire exhibited a critical current of 30 to 40 A, which was proved to be equivalent to that of this wire at the liquid nitrogen temperature.

EXAMPLE 3

Oxides or carbonates were so mixed that Bi, Pb, Sr, Ca and Cu were in composition ratios of 1.80:0.41:2.01:2.18:3.02, and this mixture was heat treated to prepare powder mainly consisting of 2212 phases and non-superconducting phases. This powder was covered with a silver pipe of 12 mm in outer diameter and 8 mm in inner diameter, and drawn into 1 mm in diameter. Then, the as-formed wire was rolled into 0.17 mm in thickness. This wire was heat treated and sintered at 845° C. for 50 hours.

Figure 3:
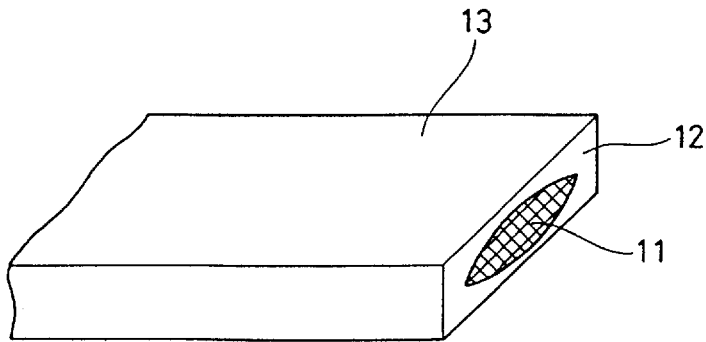
FIG. 3 is a perspective view showing a tape-type superconducting wire employed in Example 3 of the present invention.

FIG. 3 shows the as-obtained wire. Referring to FIG. 3, an oxide superconductor 11 is covered with a metal coating 12, to form a tape-type superconducting wire 13.

Figure 4:
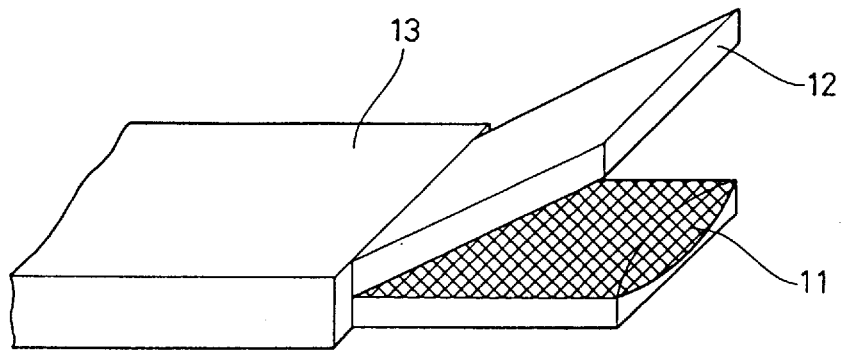
FIG. 4 is a perspective view showing an end of the tape-type superconducting wire shown in FIG. 3, from which a metal coating is separated.

The metal coating 12 was separated from one side of an end portion of this tape-type superconducting wire 13, as shown in FIG. 4.

Figure 5:
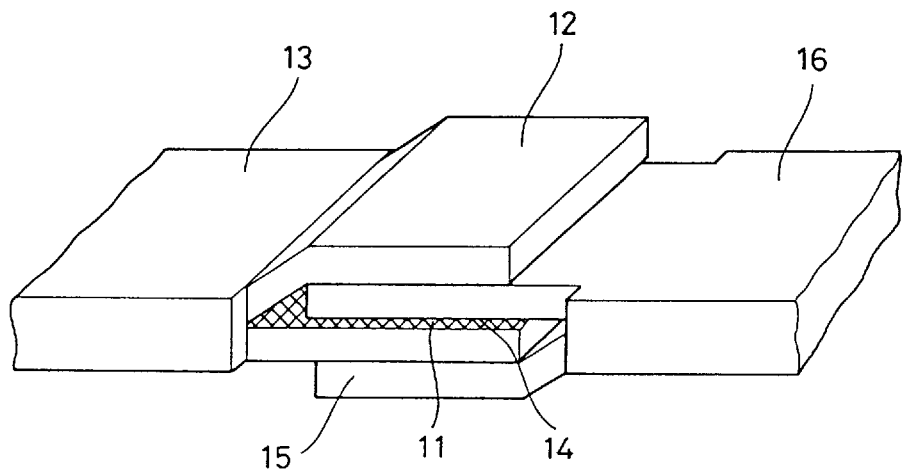
FIG. 5 is a perspective view showing the tape-type superconducting wire of FIG. 4, which is overlapped with and joined to another tape-type superconducting wire of a similar state.

FIG. 5 shows the tape-type superconducting wire 13, which was joined to another tape-type superconducting wire 16 of a similar state. The oxide superconductor 11 of the former was overlapped with an oxide superconductor 14 of the latter. A portion of the metal coating 12 separated from the end of the tape-type superconducting wire 13 was placed on the other tape-type superconducting wire 16, while a portion of a metal coating 15 separated from an end of the latter was placed on the former. In this state, the oxide superconductors 11 and 14 were overlapped with each other over a length of 10 mm.

Such tape-type superconducting wires 13 and 16 were pressed with a load of 20 tons, and rolled into 0.15 mm in thickness as a whole. The as-formed wire was heat treated at 840° C. for 50 hours. At the liquid nitrogen temperature, the junction of this wire exhibited a critical current of 30 to 40 A, which was proved to be substantially equivalent to that of this wire at the liquid nitrogen temperature.

EXAMPLE 4

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases. This powder was degassed in the atmosphere at 800° C. for 2 hours. The powder was covered with a silver pipe of 12 mm in outer diameter and 8 mm in inner diameter, drawn into 1 mm in diameter, and rolled into 0.17 mm in thickness. The as-formed wire was heat treated at 850° C. for 50 hours.

Figure 6:
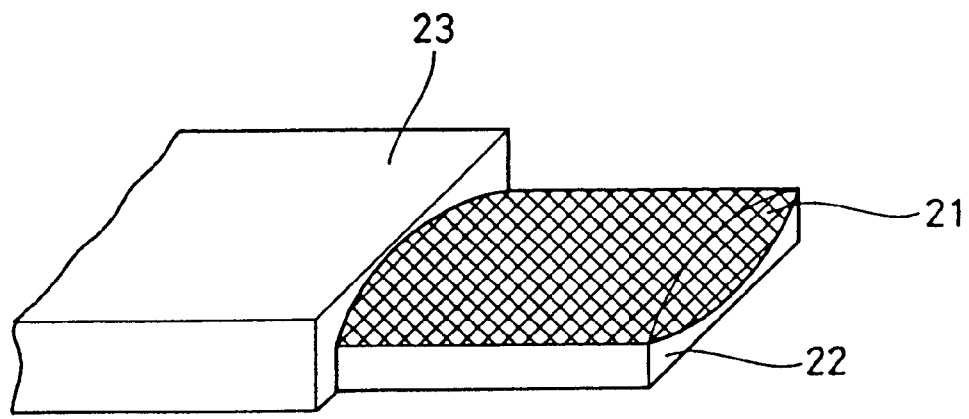
FIG. 6 is a perspective view showing an end of a tape-type superconducting wire employed in Example 4 of the present invention, from which a metal coating is separated.
Figure 7:
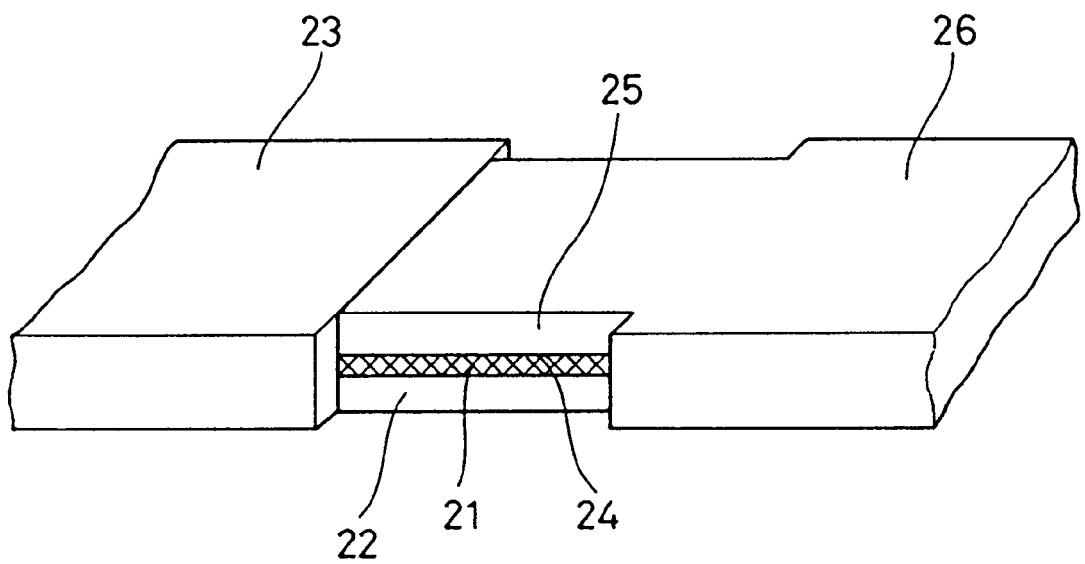
FIG. 7 is a perspective view showing the tape-type superconducting wire of FIG. 6, which is overlapped with and joined to another tape-type superconducting wire of a similar state.

FIG. 6 shows the as-obtained tape-type superconducting wire 23, which is covered with a silver coating 22. A portion of the silver coating 22 was separated from one side in an end of the tape-type superconducting wire 23 over a length of 10 mm, to expose a superconductor 21. FIG. 7 shows such a tape-type superconducting wire 23, which was combined with another tape-type superconducting wire 26 of a similar state so that the oxide superconductor 21 of the former was overlapped with an oxide superconductor 24 of the latter. Such a structure was pressed with a load of 30 tons, and thereafter heat treated at 840° C. for 50 hours. At the liquid nitrogen temperature, the as-formed wire exhibited a critical current of 30 to 40 A, which was proved to be substantially equivalent to that of this wire at the liquid nitrogen temperature.

EXAMPLE 5

Oxides or carbonates were mixed so that Bi, Pb, Sr, Ca and Cu were in composition ratios of 1.80:0.41:2.01:2.18:3.02, and this mixture was heat treated to prepare powder mainly consisting of 2212 phases and non-superconducting phases. This powder was degassed in the atmosphere at 800° C. for 2 hours. This powder was covered with a silver pipe of 12 mm in outer diameter and 8 mm in inner diameter, drawn into 1 mm in diameter, and thereafter rolled into 0.17 mm in thickness. The as-formed wire was heat treated and sintered at 845° C. for 50 hours.

Figure 8:
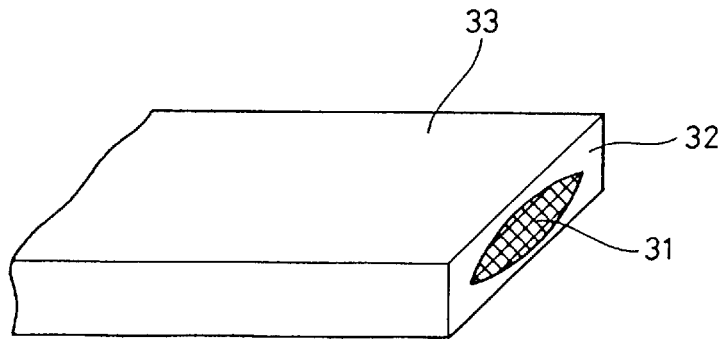
FIG. 8 is a perspective view showing a tape-type superconducting wire employed in Example 5 of the present invention.
Figure 9:
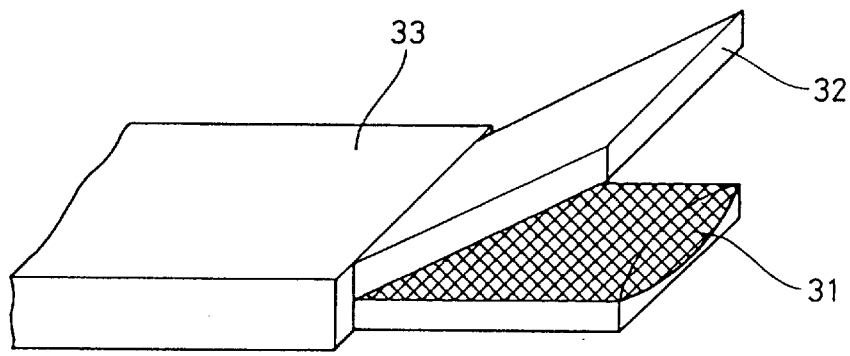
FIG. 9 is a perspective view showing an end of the tape-type superconducting wire shown in FIG. 8, from which a metal coating is separated.

FIG. 8 is a perspective view showing the as-obtained superconducting wire 33. Referring to FIG. 8, the tape-type superconducting wire 33 comprises an oxide superconductor 31 which is covered with a metal coating 32. As shown in FIG. 9, a part of the metal coating 32 was separated from an end of the tape-type superconducting wire 33, to expose the superconductor 31.

Figure 10:
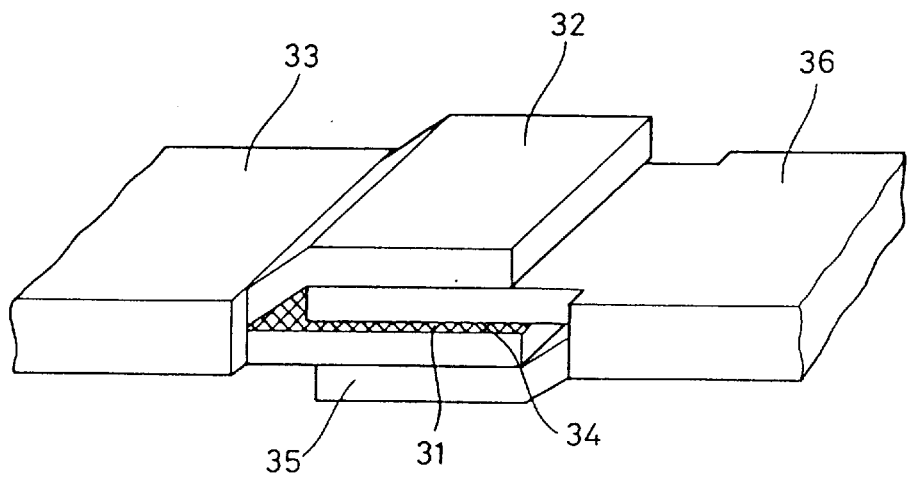
FIG. 10 is a perspective view showing the tape-type superconducting wire of FIG. 9, which is overlapped with and joined to another tape-type superconducting wire of a similar state.

FIG. 10 is a perspective view showing the tape-type superconducting wire 33 which was overlapped with and joined to another tape-type superconducting wire 36 of a similar state. As shown in FIG. 10, the superconductor 31 of the former was overlapped with a superconductor 34 of the latter over a length of 10 mm, while the separated portion of the metal coating 32 of the former was placed on the latter and a separated portion of a metal coating 35 of the latter was placed on the former. Such a structure was heat treated at 840° C. for 50 hours with application of a load of 5 tons. At the liquid nitrogen temperature, the junction of the as-formed wire exhibited a critical current of 20 to 30 A, which was equivalent to that of this wire at the liquid nitrogen temperature.

EXAMPLE 6

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases. This powder was degassed in the atmosphere at 800° C. for 2 hours. Then, this powder was covered with a silver pipe of 12 mm in outer diameter and 8 mm in inner diameter, drawn into 1 mm in diameter and rolled into 0.17 mm in thickness. The as-formed wire was heat treated at 850° C. for 50 hours.

Figure 11:
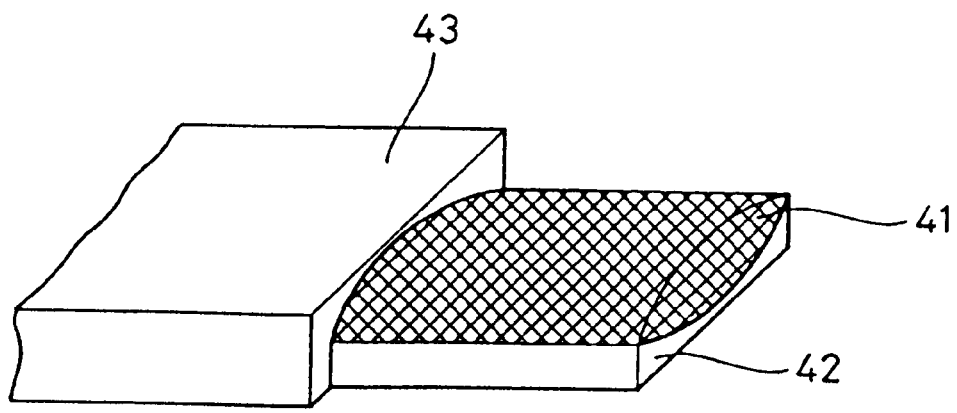
FIG. 11 is a perspective view showing an end of a tape-type superconducting wire employed in Example 6 of the present invention, from which a metal coating is separated.

FIG. 11 shows the as-obtained tape-type superconducting wire 43. Portions of its metal coating 42 were separated from one end and cross-directional both sides of the tape-type superconducting wire 43 to expose a superconductor, as shown in FIG. 11.

Figure 12:
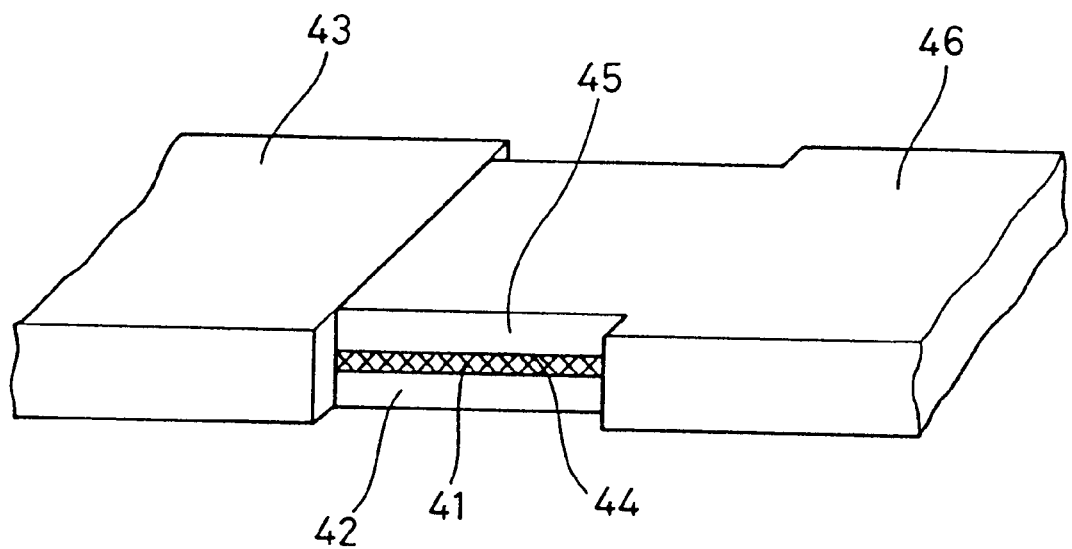
FIG. 12 is a perspective view showing the tape-type superconducting wire of FIG. 11, which is overlapped with and joined to another tape-type superconducting wire of a similar state.

FIG. 12 is a perspective view showing the tape-type superconducting wire 43, which was overlapped with and joined to another tape-type superconducting wire 46 of a similar state. Such tape-type superconducting wires 43 and 46 were so arranged that the superconductor 41 of the former was overlapped with a superconductor 44 of the latter and the overlapped portions were covered with the metal coating 42 of the former and a metal coating 45 of the latter. In such an overlapped state, the structure was wrapped in a glass tape to be supplied with a load, and heat treated at 840° C. for 50 hours.

At the liquid nitrogen temperature, the junction of the as-formed wire exhibited a critical current of 20 to 30 A, which was equivalent to that of this wire at the liquid nitrogen temperature.

EXAMPLE 7

Oxides or carbonates were mixed so that Bi, Pb, Sr, Ca and Cu were in composition ratios of 1.80:0.41:2.01:2.18:3.20, and this mixture was heat treated to prepare powder mainly consisting of 2212 phases and non-superconducting phases. This powder was degassed in the atmosphere at 800° C. for 2 hours. The powder was covered with a silver pipe of 12 mm in outer diameter and 8 mm in inner diameter, drawn into 1 mm in diameter, and thereafter rolled into 0.17 mm in thickness. At this time, the roll gap was so controlled that only a portion to be joined was 0.37 mm in thickness. The as-formed wire was heat treated and sintered at 845° C. for 50 hours.

Figure 13:
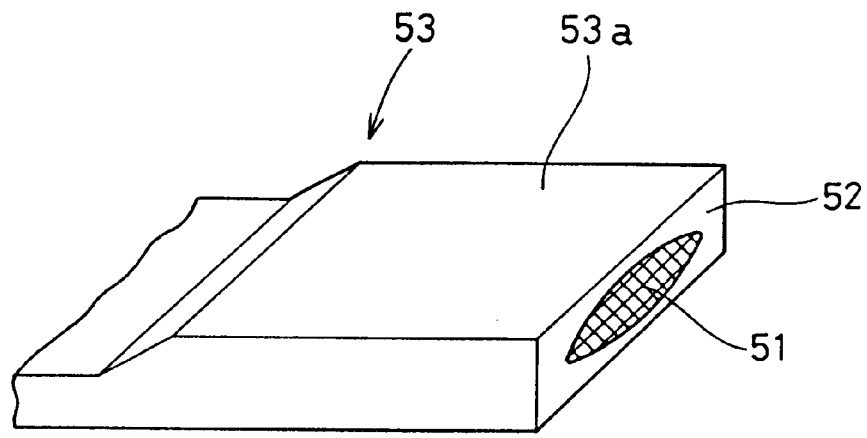
FIG. 13 is a perspective view showing a tape-type superconducting wire employed in Example 7 of the present invention.

FIG. 13 is a perspective view showing an end of the as-obtained tape-type superconducting wire 53. Referring to FIG. 13, the tape-type superconducting wire 53 comprises a superconductor 51 which is covered with a metal coating 52. A portion 53a to be joined is larger in thickness than other portions.

Figure 14:
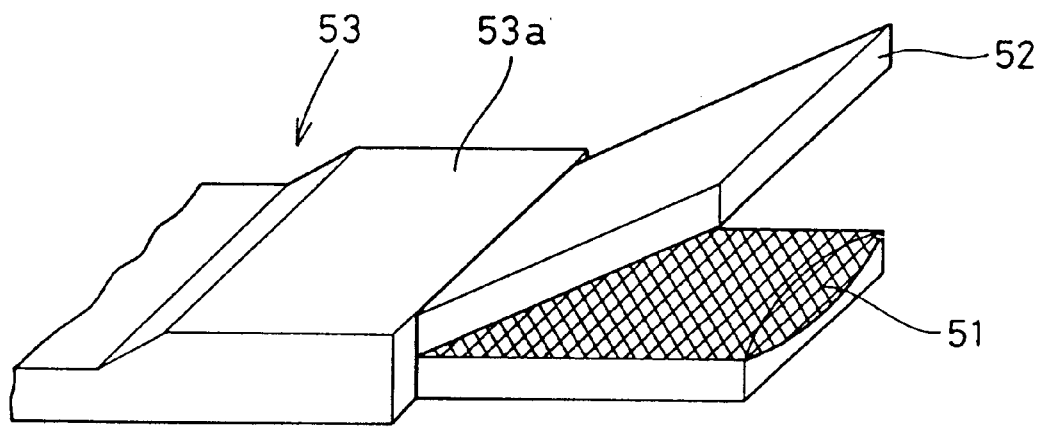
FIG. 14 is a perspective view showing an end of the tape-type superconducting wire shown in FIG. 13, from which a metal coating is separated.

FIG. 14 is a perspective view showing the end of the tape-type superconducting wire 53, from which the metal coating 52 was separated to expose the superconductor 51.

Figure 15:
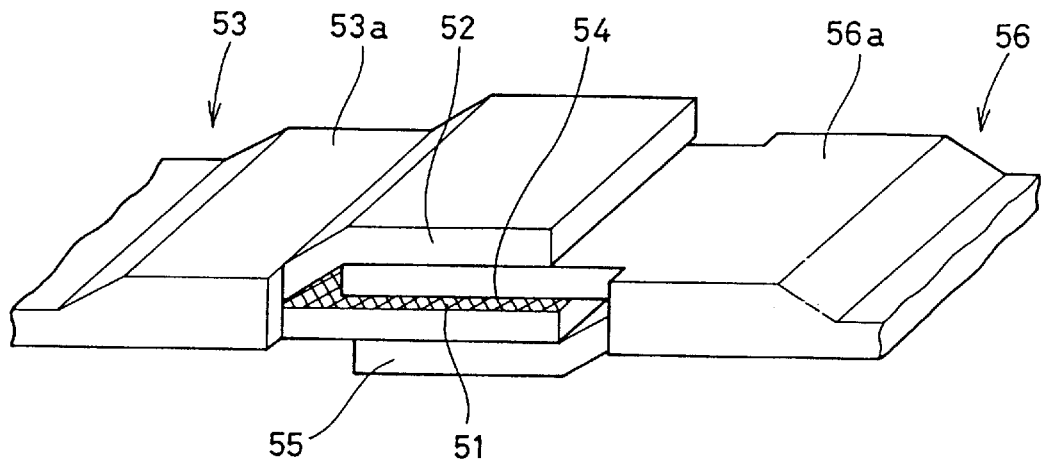
FIG. 15 is a perspective view showing the tape-type superconducting wire of FIG. 14, which is overlapped with and joined to another tape-type superconducting wire of a similar state.

FIG. 15 shows such a superconducting wire 53, which was joined with another superconducting wire 56 of a similar state. As shown in FIG. 15, the joined portion 53a of the superconducting wire 53 was butted with a joined portion 56a of the superconducting wire 56 to overlap the superconductor 51 of the former with a superconductor 54 of the latter over a length of 15 mm, so that the metal coating 52 of the former was located on the portion 56a of the latter and a metal coating 55 of the latter was located on the joined portion 53a of the former. In this state, this structure was pressed with a load of 30 tons, so that the as-formed junction was 0.25 mm in thickness. The as-formed wire was then heat treated at 840° C. for 50 hours.

At the liquid nitrogen temperature, the junction of the as-obtained wire exhibited a critical current of 35 to 45 A, while the wire itself exhibited a critical current of 25 to 30 A at the liquid nitrogen temperature. Thus, it has been confirmed possible to attain properties essential to the wire even if the state of junction is inferior.

EXAMPLE 8

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases. This powder was degassed in the atmosphere at 800° C. for 2 hours. This powder was covered with a silver pipe of 12 mm in outer diameter and 8 mm in inner diameter, drawn into 1 mm in diameter, and then rolled into 0.17 mm in thickness. The as-formed superconducting wire was 5 mm in width. A portion to be joined was first worked into 0.35 mm in thickness by controlling a roll gap, and thereafter pressed into 10 mm in width with a load of 60 tons. This wire was heat treated at 850° C. for 50 hours.

Figure 16:
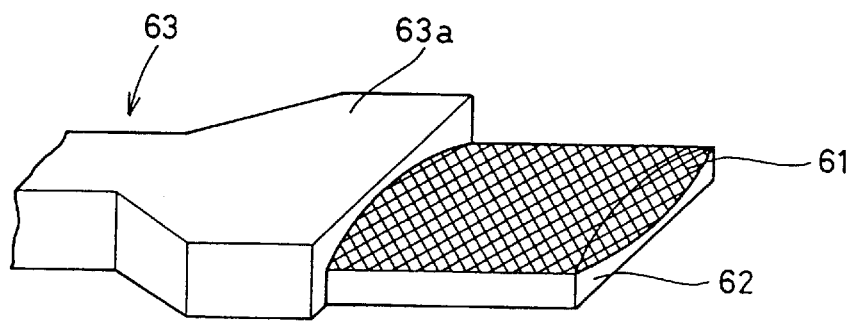
FIG. 16 is a perspective view showing an end of a tape-type superconducting wire employed in Example 8 of the present invention, from which a metal coating is separated.
Figure 17:
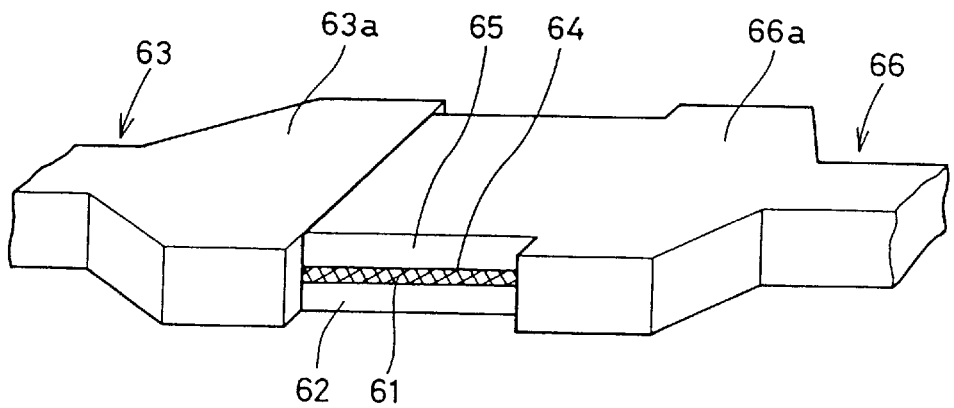
FIG. 17 is a perspective view showing the tape-type superconducting wire of FIG. 16, which is overlapped with and joined to another tape-type superconducting wire of a similar state.

FIG. 16 shows a portion 63a of the as-formed tape-type superconducting wire 63 to be joined, from which a metal coating 62 was separated to expose a superconductor 61. FIG. 17 is a perspective view showing the tape-type superconducting wire 63, which was joined to another tape-type superconducting wire 66 of a similar state. The superconductor 61 of the former was overlapped with a superconductor 64 of the latter over a length of 15 mm in forward ends of the joined portion 63a of the former and a joined portion 66a of the latter. The overlapped portions of the superconductors 61 and 64 were covered with the metal coating 62 of the former and a metal coating 65 of the latter. Such tape-type superconducting wires 63 and 66 were pressed with a load of 40 tons and heat treated at 840° C. for 50 hours, to be completely joined to each other.

At the liquid nitrogen temperature, the junction of the as-obtained wire exhibited a critical current of 40 to 47 A, while the wire exhibited a critical current of 25 to 30 A at the liquid nitrogen temperature. Thus, it has been confirmed possible to attain properties essential to the wire even if the state of junction is inferior.

EXAMPLE 9

Oxides or carbonates were mixed so that Bi, Pb, Sr, Ca and Cu were in composition ratios of 1.80:0.41:2.01:2.18:3.02, and this mixture was heat treated to prepare powder mainly consisting of 2212 phases and non-superconducting phases. This powder was degassed in the atmosphere at 800° C. for 2 hours. This powder was covered with a silver pipe of 12 mm in outer diameter and 8 mm in inner diameter, drawn into 1 mm in wire diameter and rolled into 0.17 mm in thickness. The as-formed wire was heat treated and sintered at 845° C. for 50 hours.

Figure 18:
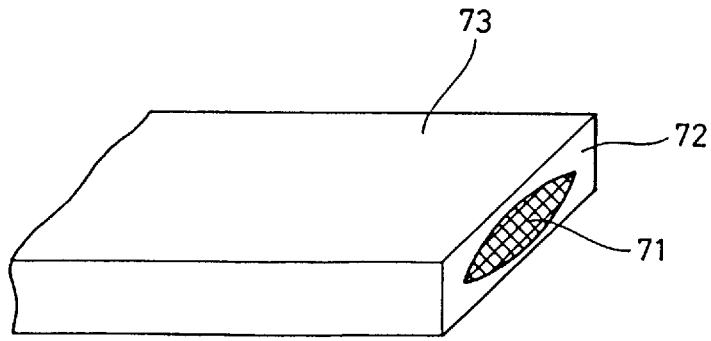
FIG. 18 is a perspective view showing a tape-type superconducting wire employed in Example 9 of the present invention.
Figure 19:
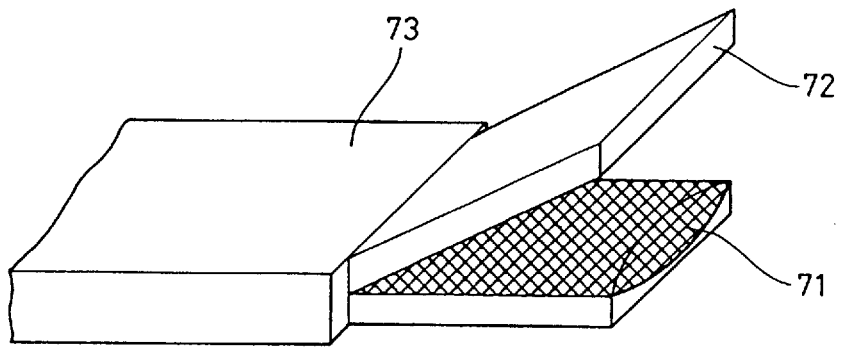
FIG. 19 is a perspective view showing an end of the tape-type superconducting wire show n in FIG. 18, from which a metal coating is separated.

FIG. 18 shows an end of the as-obtained tape-type superconducting wire 73, which comprises a superconductor 71 covered with a metal coating 72. FIG. 19 shows an end of the tape-type superconducting wire 73, from which the metal coating 72 was separated to expose the superconductor 71.

Figure 20:
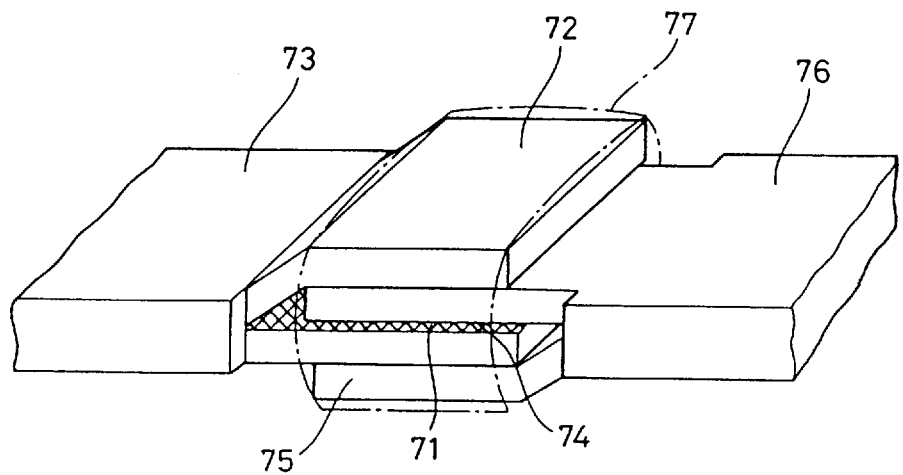
FIG. 20 is a perspective view showing the tape-type superconducting wire of FIG. 19, which is overlapped with and joined to another tape-type superconducting wire of a similar state.

FIG. 20 shows the tape-type superconducting wire 73, which was joined to another tape-type superconducting wire 76 of a similar state to overlap the superconductor 71 of the former with a superconductor 74 of the latter. A metal coating 75 of the superconducting wire 76 was placed on the tape-type superconductor 73, whose metal coating 72 was placed on the tape-type superconducting wire 76. A silver foil member 77 of 30 μm in thickness, 10 mm in width and 20 mm in length was wound on such overlapped portions, as shown by one-dot chain lines in FIG. 20. The superconductors 71 and 74 were overlapped with each other over a length of 10 mm.

Such a structure shown in FIG. 20 was pressed with a load of 30 tons and press-worked into 0.35 mm in thickness as a whole. The as-formed wire was heat treated at 840° C. for 50 hours. At the liquid nitrogen temperature, the junction of this wire exhibited a critical current of 20 to 30 A, which was equivalent to that of the wire at the liquid nitrogen temperature.

EXAMPLE 10

Figure 21:
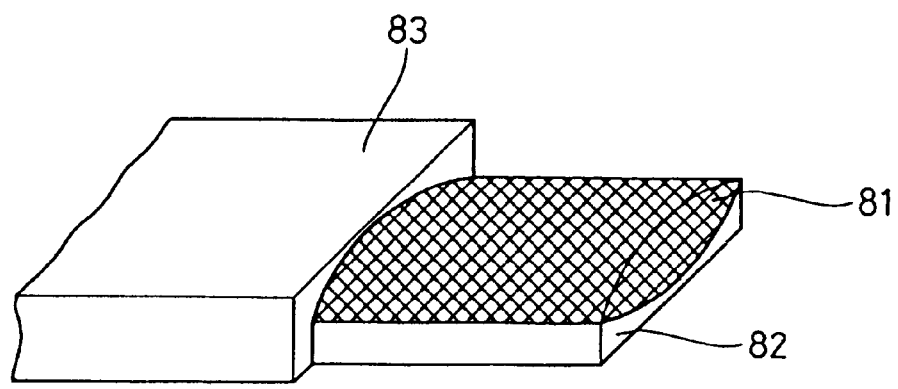
FIG. 21 is a perspective view showing an end of a tape-type superconducting wire employed in Example 10 of the present invention, from which a metal coating is separated.

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases. This powder was degassed in the atmosphere at 800° C. for 2 hours. This powder was covered with a silver pipe of 12 mm in outer diameter and 8 mm in inner diameter, drawn into 1 mm in diameter, and thereafter rolled into 0.17 mm in thickness. The as formed wire was heat treated at 850° C. for 50 hours. FIG. 21 shows an end of the as-formed tape-type superconducting wire 83, in which a silver coating 82 was separated from one side over a length of 10 mm to expose a superconductor 81.

Figure 22:
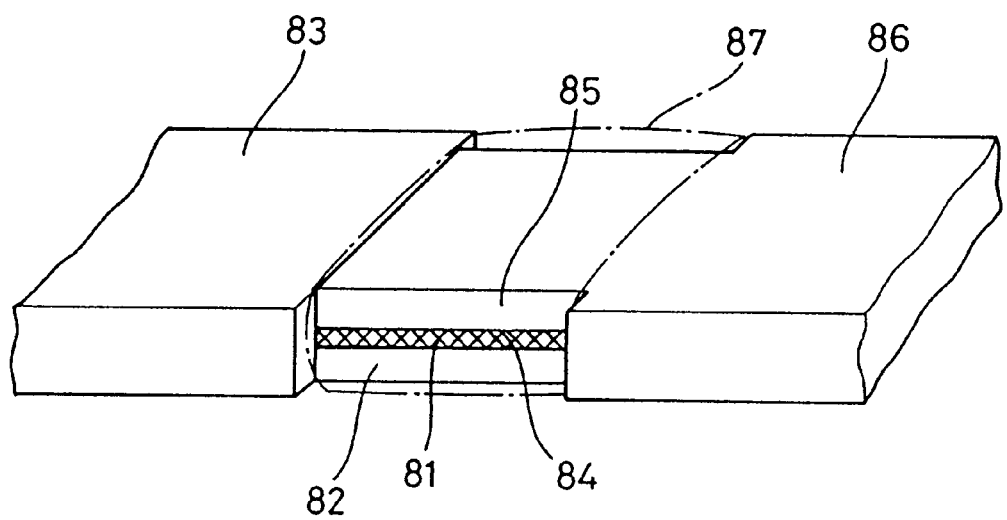
FIG. 22 is a perspective view showing the tape-type superconducting wire of FIG. 21, which is overlapped with and joined to another tape-type superconducting wire of a similar state.

FIG. 22 is a perspective view showing the tape-type superconducting wire 83, which was joined to another tape-type superconducting wire 86 of a similar state so that the superconductor 81 of the former was overlapped with a superconductor 84 of the latter, and covered with the metal coating 82 of the former and a metal coating 85 of the latter. Further, the overlapped portions were covered with a silver foil member 87 of 30 μm in thickness, 10 mm in width and 20 mm in length. In this state, the structure was pressed into 0.20 mm in thickness with a load of 40 tons, and heat treated at 840° C. for 50 hours, so that the superconductors 81 and 84 were joined to each other. At the liquid nitrogen temperature, the junction of the as-obtained wire exhibited a critical current of 20 to 30 A, which was equivalent to that of the wire at the liquid nitrogen temperature.

EXAMPLE 11

Figure 23:
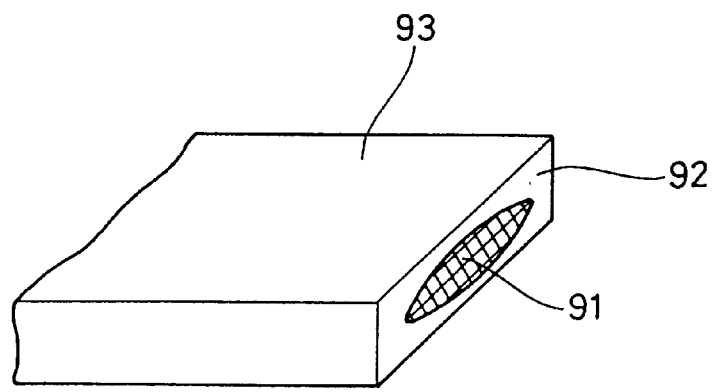
FIG. 23 is a perspective view showing a tape-type superconducting wire employed in Example 11 of the present invention.

Oxides or carbonates were mixed so that Bi, Pb, Sr, Ca and Cu were in composition ratios of 1.80:0.41:2.01:2.21:3.00, and this mixture was heat treated to prepare powder mainly consisting of 2212 phases and non-superconducting phases. This powder was degassed in the atmosphere at 800° C. for 2 hours. This powder was covered with a silver pipe of 12 mm in outer diameter and 8 mm in inner diameter, drawn into 1 mm in diameter and rolled into 0.17 mm in thickness. The as-formed wire was heat treated and sintered at 840° C. for 50 hours. FIG. 23 shows the as-obtained tape-type superconducting wire 93. Referring to FIG. 23, the tape-type superconducting wire 93 comprises a superconductor 91 which is covered with a metal coating 92.

Figure 24:
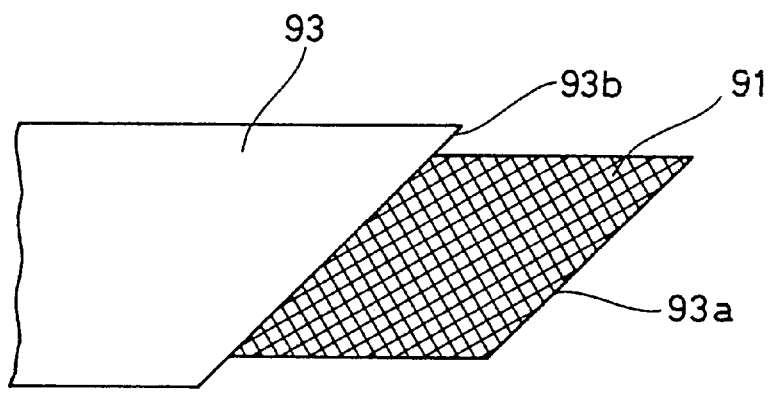
FIG. 24 is a perspective view showing an end of the tape-type superconducting wire shown in FIG. 23, from which a metal coating is separated.

FIG. 24 is a plan view showing an end of the tape-type superconducting wire 93, from which the metal coating 92 was separated. Referring to FIG. 24, an end surface 93a of the forward end of the tape-type superconducting wire 93 was cut to be inclined at a prescribed angle with respect to the cross direction. Portions of the metal coating 92 were removed from both side portions of the superconducting wire 93 along the cross direction, to expose the superconductor 91. At this time, an end surface 93b of the metal coating 92 defined by separation thereof was inclined to be in parallel with the end surface 93a of the forward end of the tape-type superconducting wire 93.

Figure 25:
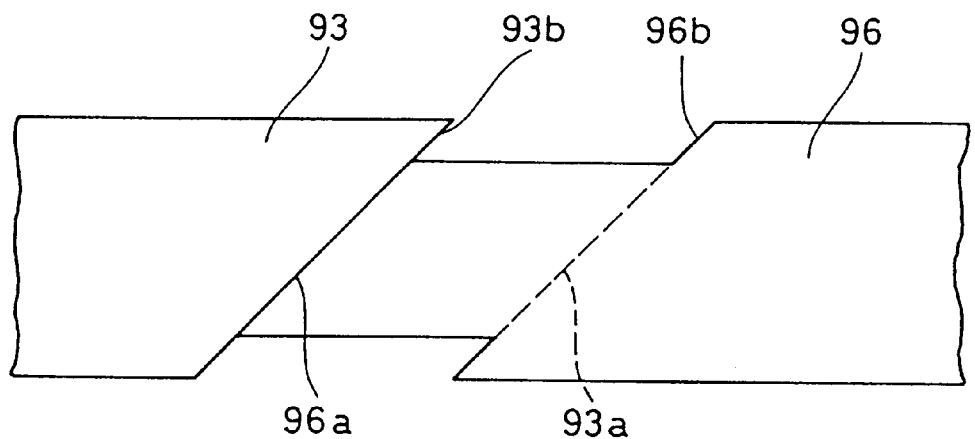
FIG. 25 is a perspective view showing the tape-type superconducting wire of FIG. 24, which is overlapped with and joined to another tape-type superconducting wire of a similar state.

FIG. 25 is a plan view showing the tape-type superconducting wire 93 which was overlapped with and joined to another tape-type superconducting wire 96 of a similar state. An end surface 96a of the forward end of the latter was butted with the end surface 93b of the metal coating 93 of the former. The end surface 93a of the forward end of the tape-type superconducting wire 93 was butted with an end surface 96b of a metal coating of the tape-type superconducting wire 96.

The superconductor 91 of the former was overlapped with that of the latter over a length of 10 mm in the longitudinal direction. Such a structure was pressed with a load of 50 tons into 0.15 mm in thickness as a whole. The as-formed wire was heat treated at 840° C. for 50 hours. At the liquid nitrogen temperature, the junction of this wire exhibited a critical current of 25 to 35 A, which was equivalent to that of the wire at the liquid nitrogen temperature. Thus, it has been proved possible to obtain a highly reliable junction.

EXAMPLE 12

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases. This powder was degassed in the atmosphere at 800° C. for 2 hours. This powder was covered with a silver pipe of 12 mm in outer diameter and 8 mm in inner diameter, drawn into 1 mm in diameter and further rolled into 0.17 mm in thickness. After the rolling, the as-formed wire was heat treated at 850° C. for 50 hours.

Figure 26:
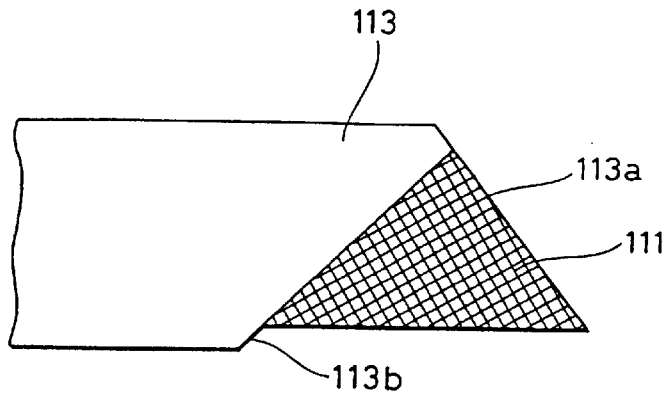
FIG. 26 is a perspective view showing an end of a tape-type superconducting wire employed in Example 12 of the present invention, from which a metal coating is separated.

An end of the as-obtained tape-type superconducting wire 113, which was similar to that shown in FIG. 23, was processed as shown in FIG. 26. Referring to FIG. 26, the forward end of the tape-type superconducting wire 113 was so cut that its end surface 113a was inclined at a prescribed angle with respect to the cross direction, and then a metal coating was separated to expose a superconductor 111. At this time, the metal coating was so separated that the as-defined end surface 113b thereof was inclined at a symmetrical angle with respect to the end surface 113a of the forward end. Thus, the superconductor 111 was exposed in a triangular form, as shown in FIG. 26.

Figure 27:
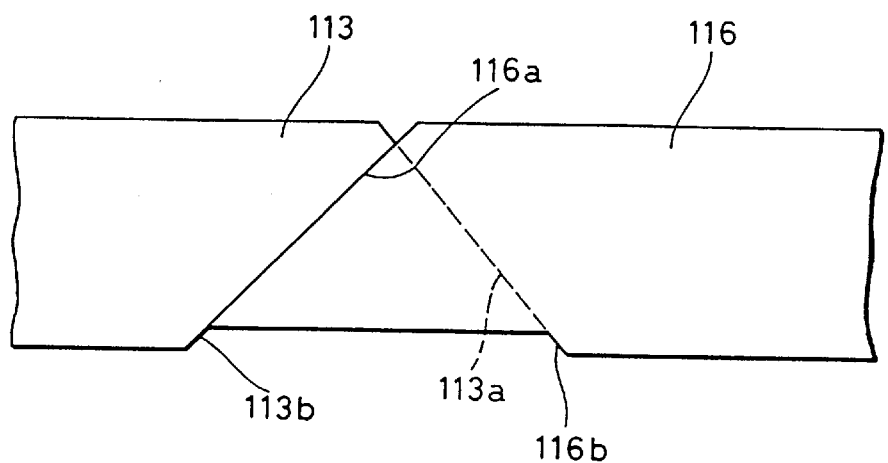
FIG. 27 is a perspective view showing the tape-type superconducting wire of FIG. 26, which is overlapped with and joined to another tape-type superconducting wire of a similar state.

FIG. 27 is a plan view showing the tape-type superconducting wire 113, which was joined to another tape-type superconducting wire 116 of a similar state. An end surface 116a of the forward end of the latter was butted with the end surface 113b of the metal coating of the former, while the end surface 113a of the forward end of the former was butted with an end surface 116b of a metal coating of the latter, to overlap the superconductors with each other. This structure was pressed with a load of 30 tons, and heat treated at 840° C. for 50 hours. At the liquid nitrogen temperature, the junction of the as-formed wire exhibited a critical current of 30 to 40 A, which was equivalent to that of the wire at the liquid nitrogen temperature. Thus, it has been proved possible to obtain a highly reliable junction.

The junctions shown in Examples 11 and 12 are superior to that obtained by forming an end portion of a tape-type superconducting wire and an end surface defined by separation of a metal coating in parallel with the cross direction of the superconducting wire. This is now described with reference to the drawings.

Figure 28:
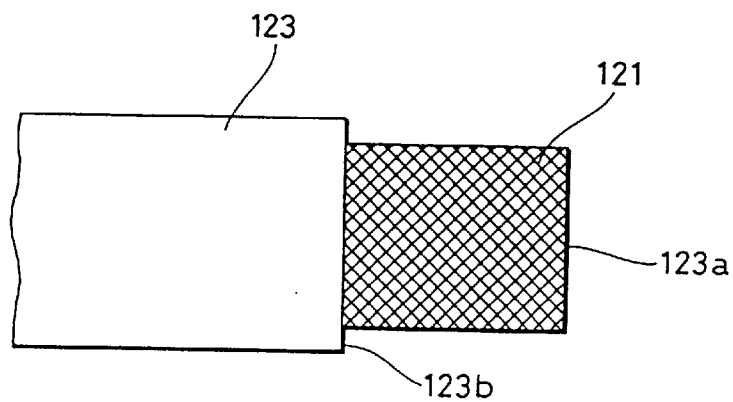
FIG. 28 is a plan view showing an end of a tape-type superconducting wire and an end surface which is formed in parallel with its cross direction by separation of a metal coating.

FIG. 28 shows an end of a tape-type superconducting wire 123 and an end surface of a metal coating, which are in parallel with the cross direction. Referring to FIG. 28, the metal coating is separated from this side along the cross direction of a joined portion at the end of the tape-type superconducting wire 123, to expose a superconductor 121. The metal coating is left on the other side (not shown) of the superconductor 121. The left portion of the metal coating and an end surface 123a of the superconductor 121 are in parallel with the cross direction. Further, an end surface 123b of the metal coating defined by separation thereof is also in parallel with the cross direction.

Figure 29:
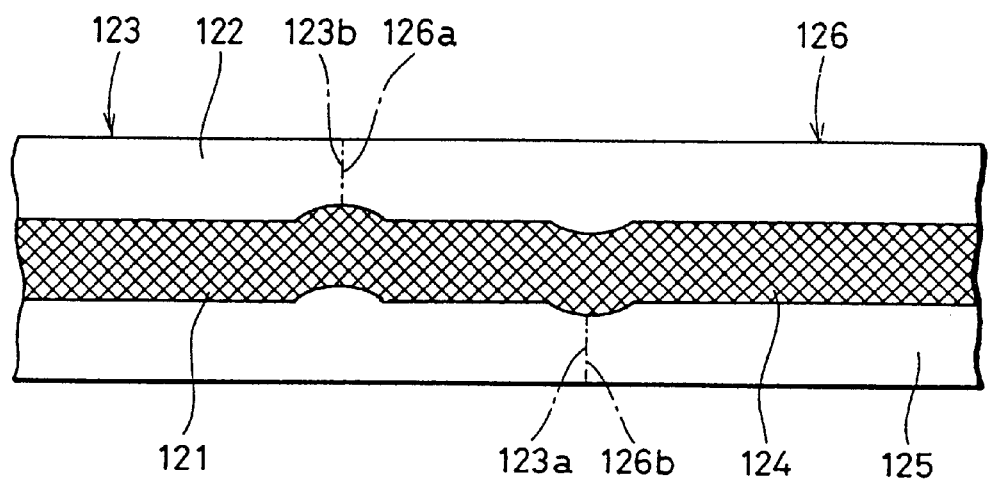
FIG. 29 is a perspective view showing the tape-type superconducting wire of FIG. 28, which is overlapped with and joined to another tape-type superconducting wire of a similar state.

FIG. 29 is a sectional view showing the tape-type superconducting wire 123, which is overlapped with and joined to another tape-type superconducting wire 126 of a similar state, so that the end surface 123a of the forward end of the former is butted with an end surface 126b of a metal coating 125 of the latter. Further, the end surface 123b of the metal coating 122 of the former is butted with an end surface 126a of the forward end of the latter.

When the tape-type superconducting wires 123 and 126 are joined to each other in the state shown in FIG. 28, a layer of the joined portion of the superconductor 121 may be displaced from that of a superconductor 124 of the superconducting wire 126, as shown in FIG. 29. Such displacement may reduce the critical current. However, it is possible to prevent such displacement by processing the ends of the superconducting wires to be inclined with respect to the cross direction, as shown in Example 11 or 12. This is because the boundary surface between the joined superconductors is elongated along the longitudinal direction of the as-formed wire. Thus, it is possible to prevent bending at the joined portions, thereby preventing reduction of the critical current.

EXAMPLE 13

Oxides or carbonates were mixed so that Bi, Pb, Sr, Ca and Cu were in composition ratios of 1.80:0.41:2.01:2.18:3.02, and this mixture was heat treated to prepare powder mainly consisting of 2212 phases and non-superconducting phases. This powder was degassed in the atmosphere at 800° C. for 2 hours. The powder was covered with a silver pipe of 12 mm in outer diameter and 8 mm in inner diameter, drawn into 1 mm in diameter, and rolled into 0.17 mm in thickness. The as-formed wire was heat treated and sintered at 845° C. for 50 hours.

Figure 30:
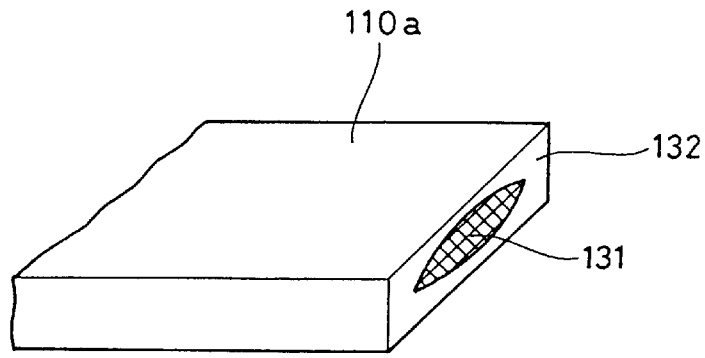
FIG. 30 is a perspective view showing a tape-type superconducting wire employed in Example 13 of the present invention.

FIG. 30 is a perspective view showing the as-obtained tape-type superconducting wire 110a which comprises a superconductor 131 covered with a metal coating 132.

Figure 31:
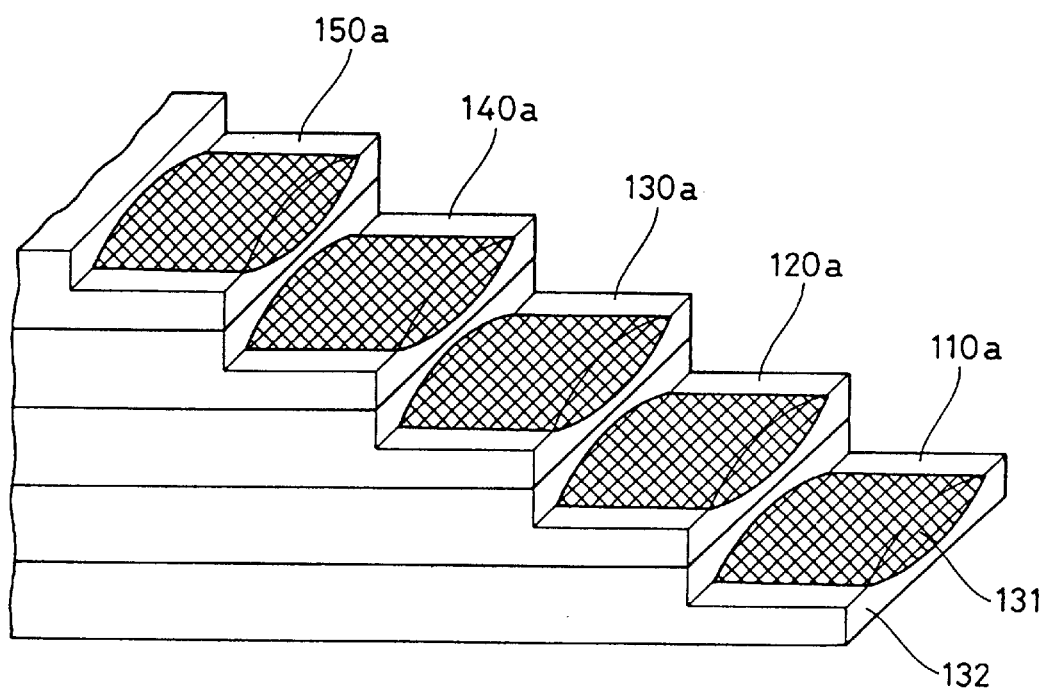
FIG. 31 is a perspective view showing ends of a plurality of stacked tape-type superconducting wires shown in FIG. 30, from which metal coatings are separated.

FIG. 31 is a perspective view showing an end of the tape-type superconducting wire 110a, from which the metal coating 132 was separated to expose the superconductor 131, with four similar tape-type superconducting wires 120a, 130a, 140a and 150a which were stacked on the tape-type superconducting wire 110a so that portions to be joined were successively displaced along the longitudinal direction.

Figure 32:
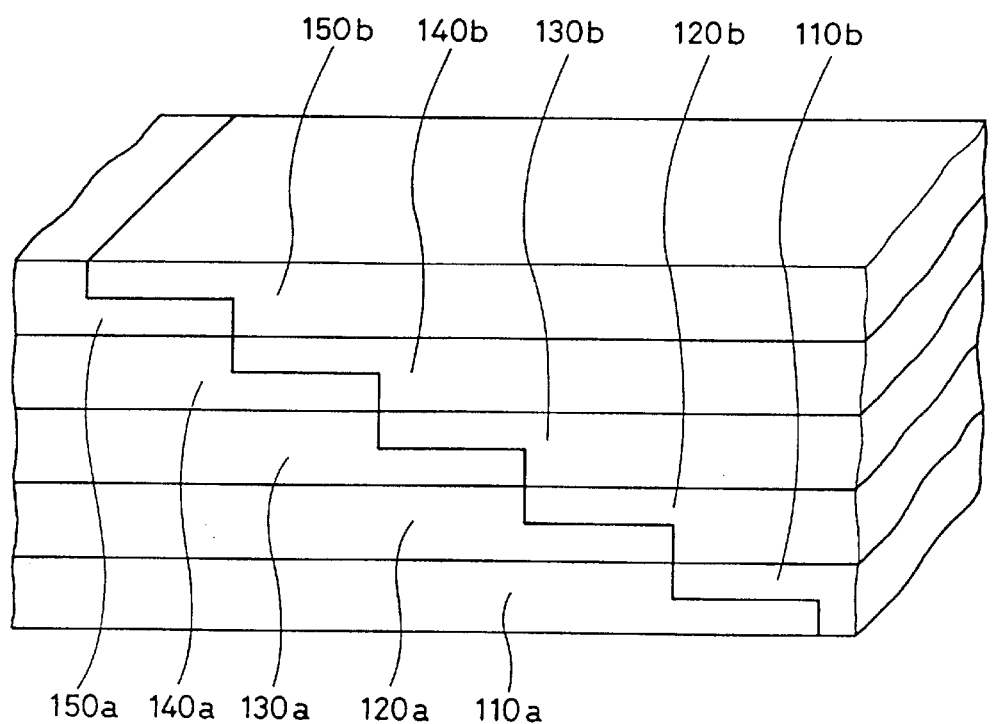
FIG. 32 is a perspective view showing the plurality of tape-type superconducting wires shown in FIG. 31, which are overlapped with and joined to another set of a plurality of tape-type superconducting wires of similar states.

As shown in FIG. 32, another structure of such tape-type superconducting wires was prepared to be overlapped with the structure shown in FIG. 31. Referring to FIG. 32, the tape-type superconducting wires 110a, 120a, 130a, 140a and 150a were overlapped with tape-type superconducting wires 10b, 120b, 130b, 140b and 150b of the other structure respectively. In this state, superconductors were overlapped with each other at the joined portions of the respective tape-type superconducting wires.

The composite of such structures was pressed with a load of 20 tons into 0.75 mm in thickness as a whole.

The as-obtained wire, which was formed by a plurality of layers of tape-type superconducting wires, was heat treated at 840° C. for 50 hours. At the liquid nitrogen temperature, the junction of this wire exhibited a critical current of 90 to 100 A, which was substantially equivalent to that of the wire at the liquid nitrogen temperature, and no reduction of the critical current was recognized at the junction.

EXAMPLE 14

Figure 33:
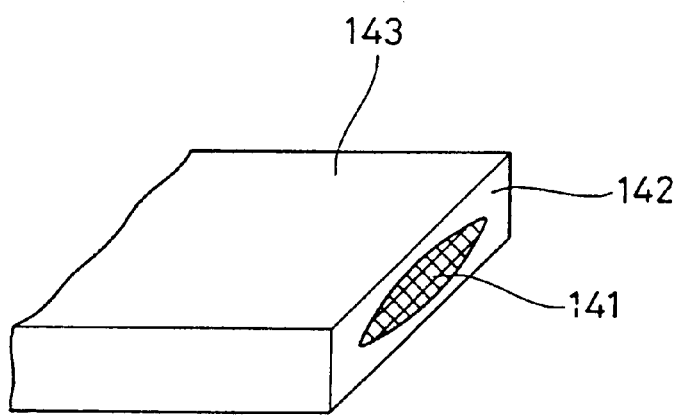
FIG. 33 is a perspective view showing a tape-type superconducting wire employed in Example 14 of the present invention.

Oxides or carbonates were mixed so that Bi, Pb, Sr, Ca and Cu were in composition ratios of 1.80:0.41:2.01:2.18:3.02, and this mixture was heat treated to prepare powder mainly consisting of 2212 phases and non-superconducting phases. This powder was degassed in the atmosphere at 800° C. for 2 hours. The powder was covered with a silver pipe of 12 mm in outer diameter and 8 mm in inner diameter, drawn into 1 mm in diameter and thereafter rolled into 0.17 mm in thickness. The as-formed wire was heat treated and sintered at 845° C. for 50 hours. FIG. 33 is a perspective view showing the as obtained tape-type superconducting wire 143, which comprises a superconductor 141 covered with a metal coating 142.

Figure 34:
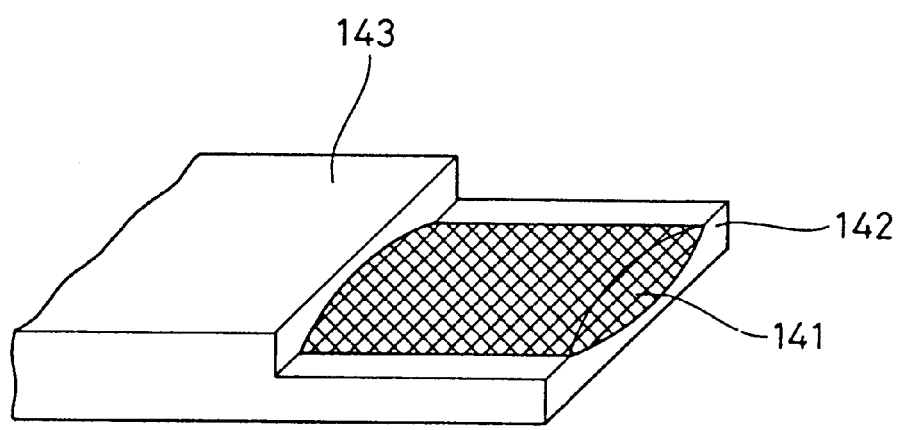
FIG. 34 is a perspective view showing an end of the tape-type superconducting wire shown in FIG. 33, from which a metal coating is separated.

As shown in FIG. 34, the metal coating 142 was separated from one side of this wire 143 to expose the superconductor 141 over a length of 20 mm along the longitudinal direction.

Figure 35:
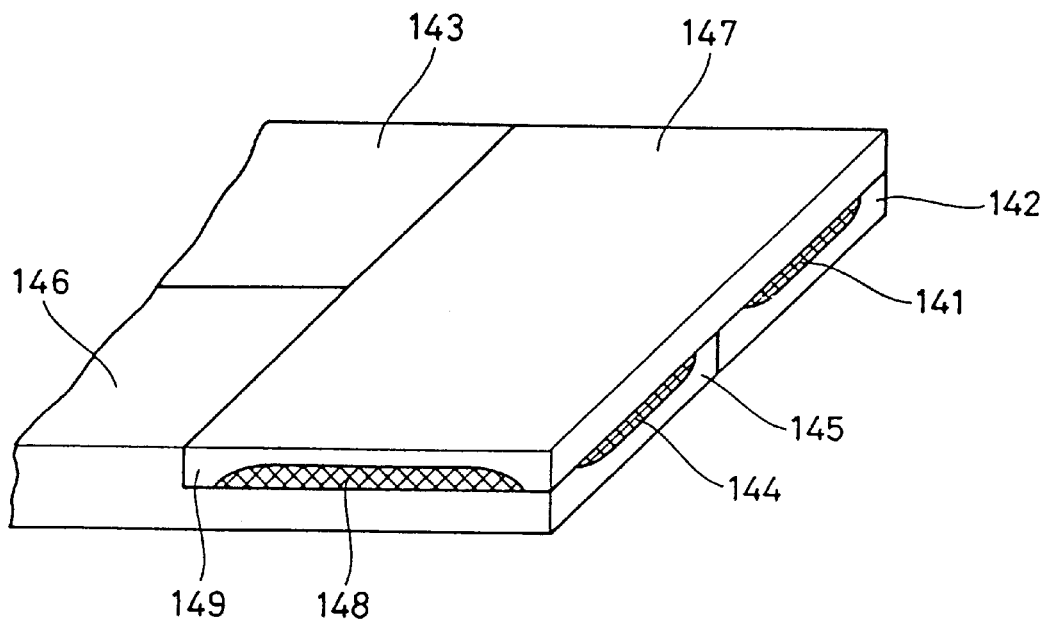
FIG. 35 is a perspective view showing a junction formed in Example 14 of the present invention.

FIG. 35 is a perspective view showing the tape-type superconducting wire 143, which was cross-directionally joined to another tape-type superconducting wire 146 of a similar state. Referring to FIG. 35, still another superconducting wire 147 was placed on these tape-type superconducting wires 143 and 146, so that a superconductor 148 of the former was overlapped on the exposed superconductors 141 and 144. The superconductor 148 was covered with a metal coating 149. In this state, the structure was pressed with a load of 20 tons into 0.15 mm in thickness as a whole. The as-formed wire was heat treated at 840° C. for 50 hours. At the liquid nitrogen temperature, the junction of the as-obtained wire exhibited a critical current of 20 to 30 A, which was substantially equivalent to that of the wire at the liquid nitrogen temperature.

EXAMPLE 15

Oxides or carbonates were mixed so that Bi, Pb, Sr, Ca and Cu were in composition ratios of 1.82:0.43:2.00:2.07:3.00, and this mixture was heat treated to prepare powder mainly consisting of 2212 phases and non-superconducting phases. This powder was degassed in the atmosphere at 800° C. for 2 hours. The powder was covered with a silver pipe of 12 mm in outer diameter and 8 mm in inner diameter, drawn into 1 mm in diameter, and thereafter rolled into 0.17 mm in thickness. The as-formed wire was heat treated at 850° C. for 50 hours.

Two such wires were prepared and the i metal coatings were separated to expose the superconductors similarly to Example 14 as shown in FIG. 34.

Figure 36:
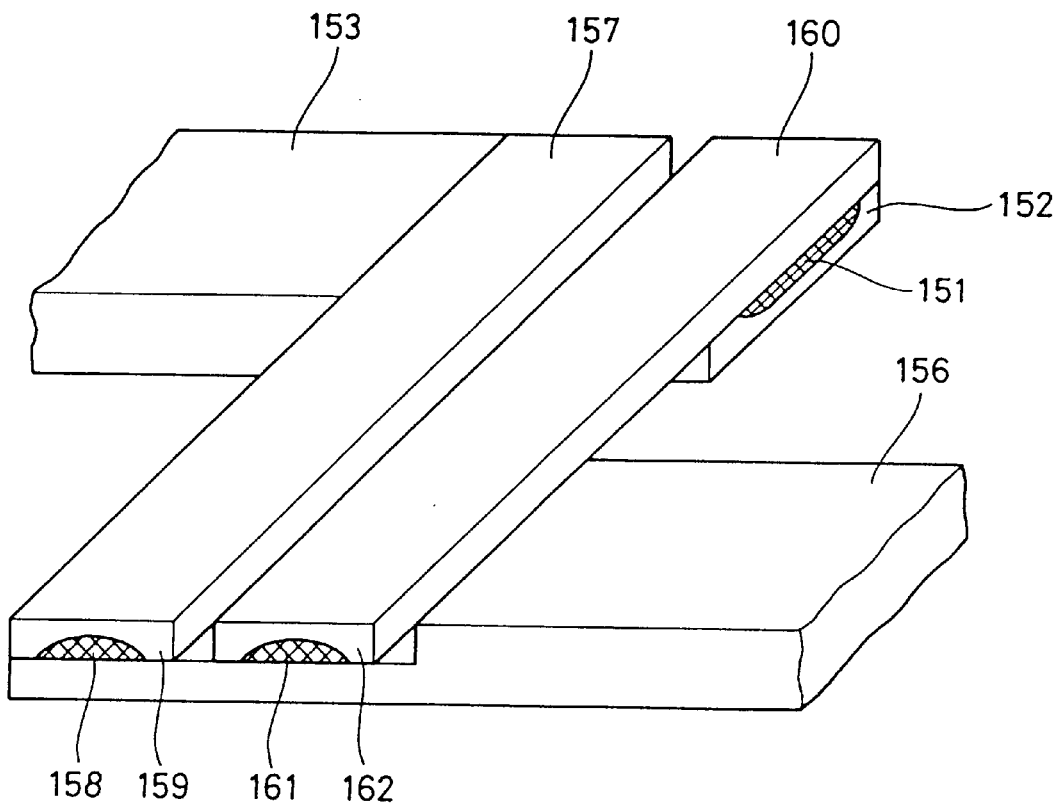
FIG. 36 is a perspective view showing a junction formed in Example 15 of the present invention.

FIG. 36 is a perspective view showing two such tape-type superconducting wires 153 and 156 which were joined to each other. At an end of the tape-type superconducting wire 153, a superconductor 151 was exposed from a metal coating 152, while a superconductor was similarly exposed from a metal coating at an end of the tape-type superconducting wire 156. Other two superconducting wires 157 and 160 were placed between these tape-type superconducting wires 153 and 156, so that a superconductor 158 was downwardly exposed from a metal coating 159 in the former while a superconductor 161 was downwardly exposed from a metal coating 162 in the latter. Thus, the superconductor 151 of the tape-type superconducting wire 153 was overlapped with that of the tape-type superconducting wire 156, while the superconductors 158 and 161 of the superconducting wires 157 and 160 were overlapped with each other. In each of the tape-type superconducting wires 153 and 156, the metal coating was separated over a length of 10 mm from its end.

The structure shown in FIG. 36 was pressed with a load of 30 tons, and heat treated at 840° C. for 50 hours. At the liquid nitrogen temperature, the junction of the as-obtained wire exhibited a critical current of 20 to 25 A, which was equivalent to that of the wire at the liquid nitrogen temperature.

According to the present invention, as hereinabove described, it is possible to provide a junction which can stably carry a superconducting current. The present invention is particularly usefully applied to a permanent current junction of a coil and a junction of a heavy-current conductor. The junction and the joining method according to the present invention are effectively applied to a cable, a bus bar, a power lead, a magnet, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of joining tape-shaped superconducting wires, said method comprising:

a step of preparing tape-shaped superconducting wires formed of metal-coated oxide superconductors having portions to be joined;

a step of separating metal coatings from first sides of said portions to be joined for exposing said oxide superconductors of said tape-shaped superconducting wires;

a step of overlapping exposed said oxide superconductors with each other so that said exposed oxide superconductors directly contact each other; and a step of joining overlapped said oxide superconductors to each other, wherein the overlapped superconductors are joined together by deformation processing and heat treatment to achieve a joined member having a thickness smaller than the sum of those of the superconducting wires to be joined and being capable of generating superconducting state at liquid nitrogen temperature.

2. A method in accordance with claim 1, wherein at least said overlapped portions of said oxide superconductors are heat treated with application of a pressure.

3. A method in accordance with claim 1, further comprising a step of covering overlapped said oxide superconductors with a metal after said step of overlapping exposed said superconductors with each other.

4. A method in accordance with claim 1, wherein said preparation step includes a step of preparing said tape-shaped superconducting wire having superconductors whose portions to be joined are larger in sectional area than other portions.

5. A method in accordance with claim 1, wherein said preparation step includes a step of forming a pair of end surfaces being inclined at pre-determined angles with respect to the cross direction of said tape-shaped superconducting wires, said separation step includes a step of exposing said oxide superconductors so that end surfaces of said metal coatings defined by separation thereof are substantially in parallel with end surfaces of said oxide superconductors or inclined substantially at symmetrical angles thereto, and said overlapping step includes a step of overlapping said oxide superconductors with each other while butting said inclined end surfaces of said oxide superconductors with said inclined end surfaces of said metal coatings on said first sides of said tape-shaped superconducting wires to be joined to the same.

6. A method in accordance with claim 1, wherein said tape-shaped superconducting wire are formed by covering oxide superconductors being selected from a group of yttrium, bismuth and thallium based superconductors with coatings of silver or a silver alloy.

7. A method in accordance with claim 1, wherein in said step of joining, the overlapped portions of said oxide superconductors are deformation-processed or press-worked and then at least the processed portions are heat treated.

8. A method of joining structures of pluralities of tape-shaped superconducting wires being formed of metal-coated oxide superconductors and overlapped in layers to each other, said method comprising:

a step of separating metal coatings from first sides of oxide superconductors to expose said oxide superconductors in respective joined portions of said pluralities of tape-shaped superconducting wires to be joined;

a step of arranging said tape-shaped superconducting wires of layers between overlapped said tape-shaped superconducting wires so that said joined portions of said tape-shaped superconducting wires of respective layers are successively displaced from each other along the longitudinal direction;

a step of overlapping exposed said oxide superconductors with each other in respective said layers so that said exposed oxide superconductors directly contact each other; and a step of joining said pluralities of said oxide superconductors being overlapped in layers to each other, wherein the overlapped superconductors are joined together by deformation processing and heat treatment to achieve a joined member having a thickness smaller than the sum of those of the superconducting wires to be joined and being capable of generating superconducting state at liquid nitrogen temperature.

9. A method in accordance with claim 8, wherein said tape-shaped superconducting wires are formed by covering oxide superconductors being selected from a group of yttrium, bismuth and thallium based superconductors with coatings of silver or a silver alloy.

10. A method in accordance with claim 8, wherein in said step of joining, the overlapped portions of said oxide superconductors are deformation-processed or press-worked and then at least the processed portions are heat treated.

11. A method in accordance with claim 8, wherein at least said overlapped portions of said oxide superconductors are heat treated with application of pressure.

12. A method of joining tape-shaped superconducting wires, said method comprising:

a step of preparing tape-shaped superconducting wires formed of metal-coated oxide superconductors having portions to be joined;

a step of separating metal coatings from first sides of said oxide superconductors in said portions to be joined for exposing said oxide superconductors of said tape-shaped superconducting wires; and a step of joining said tape-shaped superconducting wires to each other while interposing still another superconductor between exposed said oxide superconductors so that said interposed superconductor directly contacts said exposed oxide superconductors, wherein the overlapped superconductors are joined together by deformation processing and heat treatment to achieve a joined member having a thickness smaller than the sum of those of the superconducting wires to be joined and being capable of generating superconducting state at liquid nitrogen temperature.

13. A method in accordance with claim 12, wherein said tape-shaped superconducting wires are formed by covering oxide superconductors being selected from a group of yttrium, bismuth and thallium based superconductors with coatings of silver or a silver alloy.

14. A method in accordance with claim 12, wherein in said step of joining, the overlapped portions of said oxide superconductors are deformation-processed or press-worked and then at least the processed portions are heat treated.

15. A method in accordance with claim 12, wherein at least said overlapped portions of said oxide superconductors are heat treated with application of pressure.

* * * * *